US011237959B2

(12) United States Patent
Helmick et al.

(10) Patent No.: US 11,237,959 B2
(45) Date of Patent: *Feb. 1, 2022

(54) SYSTEM AND METHOD FOR A STORAGE CONTROLLER HAVING A PERSISTENT MEMORY INTERFACE TO LOCAL MEMORY

(71) Applicant: Western Digital Technologies, Inc., San Jose, CA (US)

(72) Inventors: Daniel Helmick, Broomfield, CO (US); Richard S. Lucky, Louisville, CO (US); Stephen Gold, Fort Collins, CO (US); Ryan R. Jones, Mesa, AZ (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/711,294

(22) Filed: Dec. 11, 2019

(65) Prior Publication Data

US 2020/0117595 A1 Apr. 16, 2020

Related U.S. Application Data

(63) Continuation of application No. 15/628,361, filed on Jun. 20, 2017, now Pat. No. 10,521,343.

(Continued)

(51) Int. Cl.
*G06F 12/06* (2006.01)
*H01L 27/105* (2006.01)
(Continued)

(52) U.S. Cl.
CPC ...... *G06F 12/0623* (2013.01); *G06F 12/0246* (2013.01); *G06F 12/0653* (2013.01); *H01L 27/1052* (2013.01); *G06F 12/0661* (2013.01); *G06F 12/1072* (2013.01); *G06F 2212/7203* (2013.01); *G06F 2212/7208* (2013.01); *G06F 2212/7209* (2013.01)

(58) Field of Classification Search
CPC .................................................. G06F 12/0292
See application file for complete search history.

(56) References Cited

U.S. PATENT DOCUMENTS 7,574,538 B1 * 8/2009 Yochai ................. G06F 3/0613
710/36
9,064,569 B1 6/2015 Gorobets
(Continued)

OTHER PUBLICATIONS

Application as Filed in U.S. Appl. No. 15/297,953, entitled, "Media Controller and Method for Management of CPU-Attached Non-Volatile Memory", filed Oct. 19, 2016, 56 pages.

(Continued)

*Primary Examiner* — Edward J Dudek, Jr.
(74) *Attorney, Agent, or Firm* — Morgan, Lewis & Bockius LLP

(57) ABSTRACT

A storage system with a controller having a persistent memory interface to local memory is provided. The persistent memory can be used to store a logical-to-physical address table. A logical-to-physical address table manager, local to the controller or remote in a secondary controller, can be used to access the logical-to-physical address table. The manager can be configured to improve bandwidth and performance in the storage system.

20 Claims, 9 Drawing Sheets

Related U.S. Application Data

(60) Provisional application No. 62/518,408, filed on Jun. 12, 2017.

(51) Int. Cl.
*G06F 12/02* (2006.01)
*G06F 12/1072* (2016.01)

(56) References Cited

U.S. PATENT DOCUMENTS

| | | | |
|---|---|---|---|
| 10,521,343 B2* | 12/2019 | Helmick | G06F 12/0653 |
| 2011/0161621 A1* | 6/2011 | Sinclair | G06F 12/0246 |
| | | | 711/207 |
| 2014/0047165 A1* | 2/2014 | Nemazie | G06F 12/0246 |
| | | | 711/103 |
| 2015/0039814 A1* | 2/2015 | Lim | G06F 12/0246 |
| | | | 711/103 |
| 2016/0132240 A1 | 5/2016 | Berke et al. | |
| 2016/0299710 A1* | 10/2016 | Chang | G06F 3/061 |
| 2017/0068621 A1* | 3/2017 | Watanabe | G06F 12/0871 |
| 2018/0067849 A1 | 3/2018 | Kanno | |

OTHER PUBLICATIONS

Application as Filed in U.S. Appl. No. 15/297,971, entitled, "Electrically-Buffered NV-DIMM and Method for Use Therewith", filed Oct. 19, 2016, 86 pages.

Application as Filed in U.S. Appl. No. 15/297,982, entitled, "Storage System with Integrated Components and Method for Use Therewith", filed Oct. 19, 2016, 111 pages.

Application as Filed in U.S. Appl. No. 15/297,993, entitled, "Storage System with Several Integrated Components and Method for Use Therewith", filed Oct. 19, 2016, 114 pages.

Application as Filed in U.S. Appl. No. 15/298,025, entitled, "Media Controller with Response Buffer for Improved Data Bus Transmissions and for Use Therewith", filed Oct. 19, 2016, 98 pages.

Application as Filed in U.S. Appl. No. 15/631,293, entitled, "Storage System and Method for Improved Generation and Storage of Data Protection Information", filed Jun. 23, 2017, 41 pages.

* cited by examiner

SYSTEM AND METHOD FOR A STORAGE CONTROLLER HAVING A PERSISTENT MEMORY INTERFACE TO LOCAL MEMORY

CROSS-REFERENCE TO RELATED APPLICATIONS

This application is a continuation application of application Ser. No. 15/628,361, filed on Jun. 20, 2017, now U.S. Pat. No. 10,521,343, which claims the benefit of U.S. Provisional Application No. 62/518,408, filed on Jun. 12, 2017, the entirety of each of which is incorporated herein by reference.

BACKGROUND

Some storage systems receive read and write commands from a host with a logical address and translate the logical address to a physical address in non-volatile memory. The translation can be performed using a logical-to-physical address table. In some storage systems, the logical-to-physical address table is stored in the non-volatile memory but is copied to volatile memory (e.g., RAM), as accessing the logical-to-physical address table from volatile memory is faster than accessing it from the non-volatile memory. If a write command results in data for a logical address being moved to a different physical address, a notation of the change can be made and later stored in the non-volatile memory, so that the logical-to-physical address table stored in the non-volatile memory will be up to date.

DETAILED DESCRIPTION

Figure 1A:
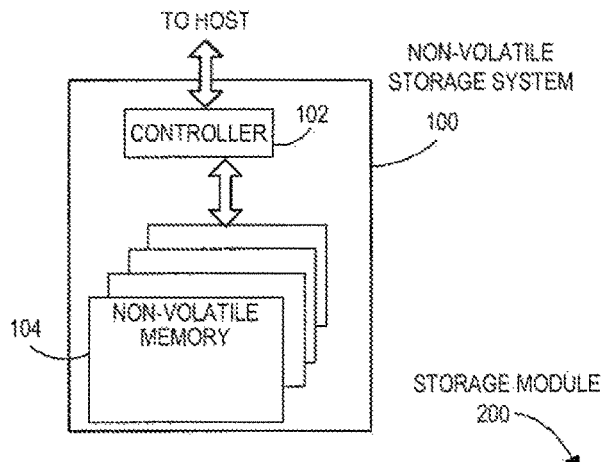
FIG. 1A is a block diagram of a non-volatile storage system of an embodiment.
Figure 1B:
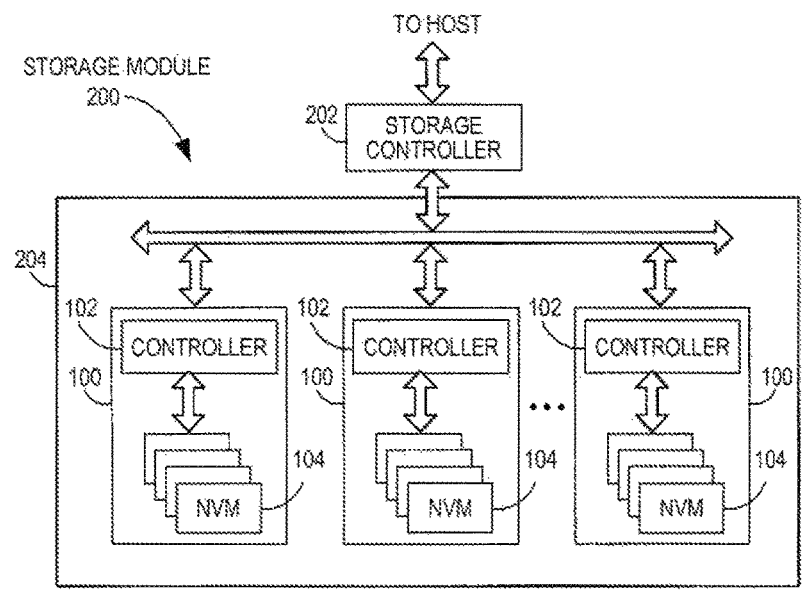
FIG. 1B is a block diagram illustrating a storage module of an embodiment.
Figure 1C:
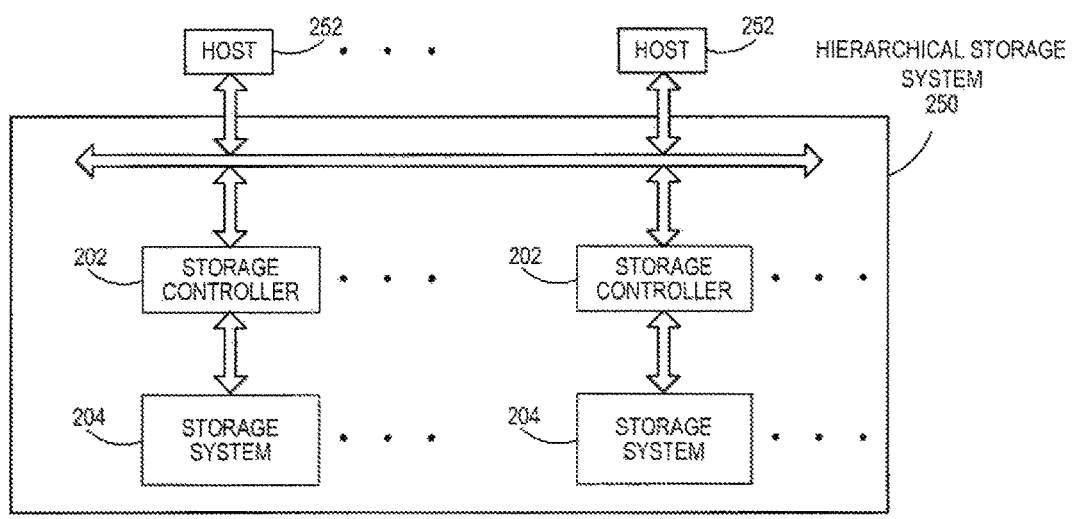
FIG. 1C is a block diagram illustrating a hierarchical storage system of an embodiment.

Turning now to the drawings, storage systems suitable for use in implementing aspects of these embodiments are shown in FIGS. 1A-1C. FIG. 1A is a block diagram illustrating a non-volatile storage system 100 according to an embodiment of the subject matter described herein. Referring to FIG. 1A, non-volatile storage system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. It should be noted that while "die" and "Flash" are used in this example, these embodiments can be used with any suitable type of memory, such as, but not limited to, NAND (e.g., 3D and 2D), persistent memories (e.g., ReRam, PCM, OxRAM, MRAM), hard disk drives (HDD), optical storage, and magnetic (tape) storage). Controller 102 interfaces with a host system and transmits command sequences for read, program, and erase operations to non-volatile memory die 104.

The controller 102 (which may be a flash memory controller, but, as noted above, the memory does not need to be flash) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. For example, hardware can refer to circuits, logic, and transistor gates to service some function in a larger system. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it can communicate with the flash memory controller. If the host provides a logical address to which data is to be read/written, the flash memory controller can convert the logical address received from the host to a physical address in the flash memory. (Alternatively, the host can provide the physical address.) As noted above, the memory does not need to be flash, so the "flash memory controller" will often be referred to herein as "memory controller" or just "controller." A memory controller can also perform various memory management functions, such as, but not limited to, wear leveling (distributing writes to avoid wearing out specific blocks of memory that would otherwise be repeatedly written to in persistent ("program in place") media (e.g., PCM, OxRAM, ReRAM, MRAM, NOR)) and garbage collection (after a block is full, moving only the valid pages of data to a new block, so the full block can be erased and reused in flash or block-accessible storage media). Also, as noted above, when "memory die" is used in this example, any type of memory can be used. Accordingly, the specifics of the wear leveling algorithm and other details discussed herein can alter depending on the exact type of memory used. For example, when the memory takes the form of a hard drive, tape drive, or optical drive, a head positioning algorithm can be used. Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), quad-level cells (QLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800; ONFI (open NAND Flash interface); and DDR DRAM.

In one embodiment, storage system 100 may be a card-based system, such as a secure digital (SD) or a micro secure digital (micro-SD) card. In an alternate embodiment, storage system 100 may be part of an embedded storage system.

Although, in the example illustrated in FIG. 1A, non-volatile storage system 100 (sometimes referred to herein as a storage module) includes a single channel between controller 102 and non-volatile memory die 104, the subject matter described herein is not limited to having a single memory channel. For example, in some NAND storage system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile storage systems 100. As such, storage module 200 may include a storage controller 202 that interfaces with a host and with storage system 204, which includes a plurality of non-volatile storage systems 100. The interface between storage controller 202 and non-volatile storage systems 100 may be a bus interface, such as a serial advanced technology attachment (SATA), a peripheral component interface express (PCIe) interface, or SD and microSD interfaces. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
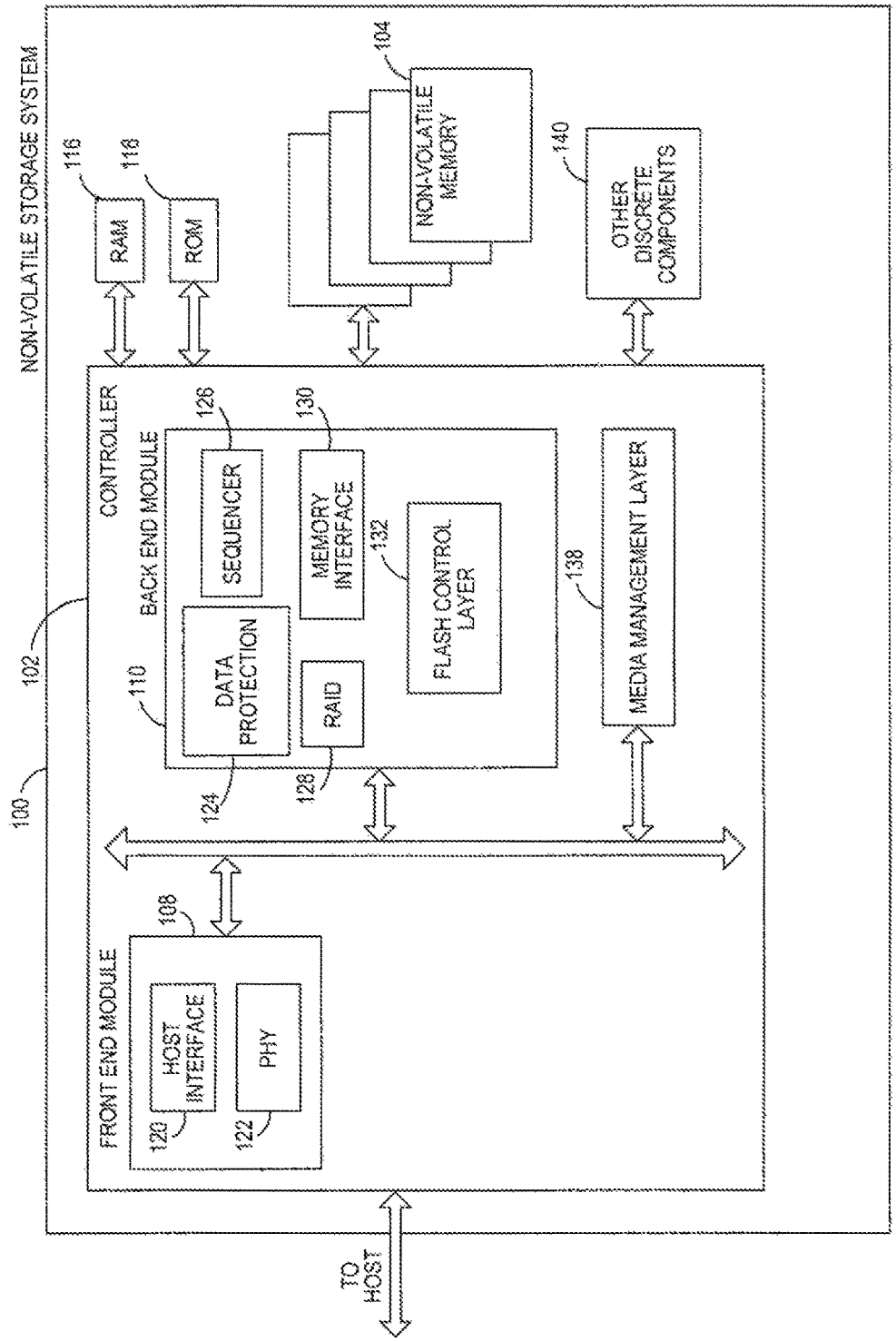
FIG. 2A is a block diagram illustrating components of the controller of the non-volatile storage system illustrated in FIG. 1A according to an embodiment.

FIG. 2A is a block diagram illustrating components of controller 102 in more detail. Controller 102 includes a front end module 108 that interfaces with a host, a back end module 110 that interfaces with one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules can be implemented in hardware or software/firmware.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes a data protection module 110, which can generate and process data protection information, such as error detection codes and error correction codes. For example, in one embodiment, the controller 102 comprises an error correction code (ECC) engine that encodes the data bytes received from the host, and decodes and error corrects the data bytes read from the non-volatile memory. Any suitable type of EDC or ECC can be used. For example, a cyclical redundancy check (CRC) can be used for EDC. In a system that stores a logical address with the data, an EDC check can examine the logical address for correctness and match the expected logical address value. More generally, this involves storing a known value in a known position with the data and checking the known value on decode. Examples of ECC include, but are not limited to, BCH, RS, and XOR, and LDPC.

A command sequencer (or scheduler) 126 generates command sequences, such as read, program and erase command sequences, to be transmitted to the non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

The storage system 100 also includes other discrete components 140, such as external electrical interfaces, external RAM, resistors, capacitors, or other components that may interface with controller 102. In alternative embodiments, one or more of the PHY 122, RAID module 128, media management layer 138 and buffer management/bus controller 114 are optional components that are not necessary in the controller 102. The media management layer 138 can do operations, such as, but not limited to, wear leveling, garbage collection, retention management, disturb management.

Figure 2B:
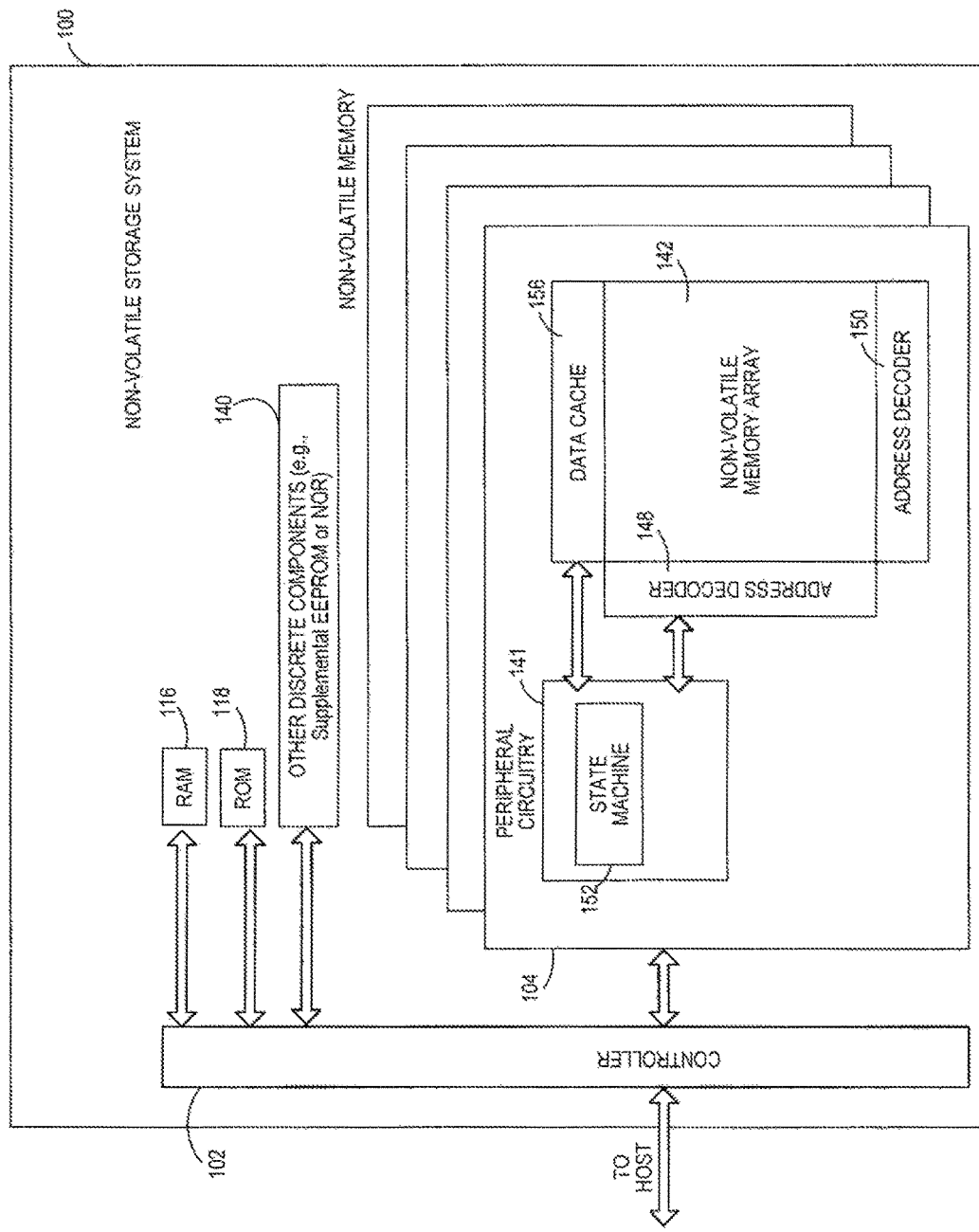
FIG. 2B is a block diagram illustrating components of the non-volatile memory storage system illustrated in FIG. 1A according to an embodiment.

FIG. 2B is a block diagram illustrating components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Non-volatile memory die 104 further includes a data cache 156 that caches data. Peripheral circuitry 141 includes a state machine 152 that provides status information to the controller 102.

Figure 3:
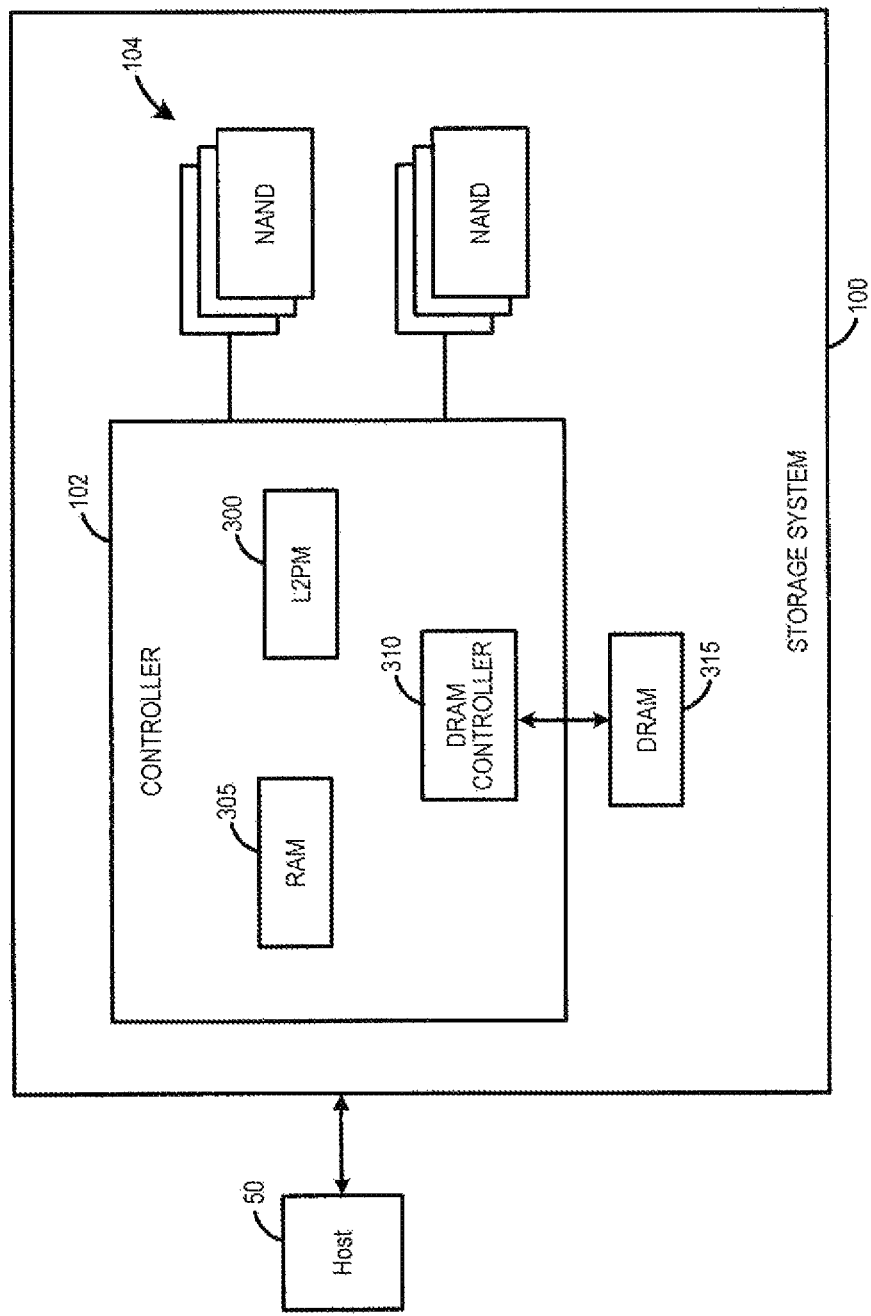
FIG. 3 is a block diagram of a storage system of an embodiment.

FIG. 3 is a simplified view of the storage system 100 of an embodiment, showing some of the components discussed above and adding others. It should be noted that this is merely an example, and other implementations can be used. As shown in FIG. 3, in this embodiment, the storage system 100 comprises a controller 102 having a logical-to-physical address manager (L2PM) 300, RAM which is often a variety of SRAM 305, and a DRAM controller 310 in communication with DRAM 315. Although RAM 305 is shown inside the controller 102 and DRAM 315 is shown outside the controller 102, other configurations are possible. Also, while RAM, SRAM and DRAM are used in this example, it should be understood that other forms of memory can be used, and such other forms of possible non-volatile, as well as volatile, varieties (e.g., RAM could be ReRAM or MRAM, which is a persistent memory).

In this embodiment, the host uses a logical address (e.g., a logical block address (LBA)) in read and write commands, while the storage system 100 uses physical addresses of memory locations in the non-volatile memory array 104. The storage system 100 uses a logical-to-physical address table (or map or other data structure; "table" will be used herein for simplicity) that associates logical address from the host with physical address of the non-volatile memory array 104. One of the functions of the controller 102 can be to use this table (sometimes referred to herein as the "L2P table") to find a physical address associated with a logical address. The L2P table may or may not be a hierarchical lookup using one or more tables. That is, the physical part of an entry in the table may be an indirect reference (i.e., it may not contain the entire physical location—some or parts of it may need to be determined/calculated). In one embodiment, the hardware/firmware/software that is responsible for this look-up and other activity with respect to the L2P table is the logical-to-physical address manager (or "L2PM") 300. In embodiments where the L2PM 300 is part of the controller 102, the functionality of the L2PM will sometimes be mentioned as being performed generally by the controller 102.

Because the associations in the L2P table need to be used across power cycles, in one embodiment, the L2P table is stored in non-volatile media. This storage may be in alternative media such as a supplemental EEPROM or NOR 140, or it may be on the non-volatile memory array 104. However, in this embodiment, the L2P table is copied (e.g., during boot-up of the storage system 100) from the non-volatile memory array 104 to DRAM 315, as the L2P table can be accessed more quickly from DRAM 315 than the non-volatile memory array 104. Also, in some embodiments, the L2P table is very large, and only a portion of the L2P table is copied from the non-volatile memory array 104 to DRAM 315. Accordingly, for simplicity, the phrase "the L2P table" will be used herein to refer to either the entire L2P table or a portion of the L2P table.

After the L2P is copied into DRAM 315, the L2PM 300 can access the L2P table (via the DRAM controller 310) to perform logical-to-physical address translations. For example, when the host sends a read command with a logical address to the storage system 100, the L2PM 300 queries the L2P table in DRAM 315 with the logical address to find the associated physical address. The controller 102 then reads the data stored in that physical address in the non-volatile memory die 104 and returns the read data to the host.

An issue can arise, however, when the host is attempting to read data from a logical address that is in the process of being updated. As will be discussed in more detail in the following paragraphs, when the storage system 100 receives a write command to change previously stored data at a logical address, the data held at the corresponding physical address in the L2P table will no longer be current, as the physical address pointed to by the L2P table will no longer hold the current data. When the write actually takes place, the L2P table can be updated (as will be discussed below). However, when a write command is in the process of being performed (i.e., when the data in the write command is "in flight"), the entry in the L2P table for the logical address will be "stale," as data read from the corresponding physical address will not be the most-recent data. Various stages of the write command may include, but not be limited to, the following command receipt: L2P look-up, L2P stale marking, temporary data location tracking, command ordering, address selection for programming, media conflict checks, data scrambling, EDC creation, ECC encode, data transfer, media program, media status check, write command confirmation, command clean-up, host command completion, and updated L2P table storage.

There are several ways that the "data in flight" issue can arise. For example, the data may have been received by the storage system 100 just after the read command to the same logical address was received. (The interface protocol (e.g., SAS, SATA, NVMe) used by the storage system 100 can dictate whether a write needs to be examined in relationship to a particular read command.) As another example, there can be an intermediate update to DRAM, but the data and write command are still in the controller's RAM 305, are being transferred in the bus, or is in the process of being programmed. As yet another example, a write operation can be complete, but the update to the L2P table in DRAM 315 has not occurred yet. A "data in flight" issue can also arise in a garbage collection situation, where read data is in the RAM 305 in the controller 102 and is about to be programed to a new location. This is similar to the above write flow, but could be read from the cache location.

To account for the "data in flight" issue, when the storage system 100 receives a new write command to a logical address, the controller 102 can set a "stale bit" in the L2P table. That way, when a later read is requested for the logical address, the controller 102 can know that the entry in the L2P table for that logical address is not to be used. That is, as the controller 102 will not know just by looking at the read command whether there is a "data in flight" issue, when the controller 102 gets a read command from the host, the controller 102 can check all write commands and data in flight by checking for the stale bit in the L2P table entry and/or by or checking to see if the L2P table entry is a temporary location such as a RAM address or DRAM address. If it is, the controller 102 can return the in-flight data to the host (e.g., after optionally performing ECC correction, descrambling, or other data processing operations).

As alluded to previously, a write operation can cause the L2P table stored in the DRAM 116 to be out of date. The following paragraphs describe the write operation in more detail.

When the storage system 100 receives a write command, data, and a logical address from the host, the controller 102 can order the write command with other commands that are in flight according to interface rules (e.g., SAS, SATA, NVMe). The temporary write RAM 305 location is then chosen, and the L2PM 300 can either set the stale bit or sets the L2P entry to the RAM 305 location. The old location of the L2P entry is then returned. If a write to the same LBA is identified (i.e., the old location was a RAM 305 location identifying this data as being in flight), ordering rules of the interface (SAS, SATA, NVMe) can be adhered to. Further, the cancellation or data consistency choices of in flight writes to the same LBA may occur. Media tracking metadata may be updated (the old NAND location can be invalid; thus, the valid page count for that NAND erase block location can be decremented.) The metadata may or may not be in RAM 305 or DRAM 315. The new media physical location is selected for this write command, and the write data that has been sitting in RAM 305 is transferred to the media 104 and programmed. The new physical location is updated by the L2PM 300. If they exist, the stale bits are cleared, and the RAM 305 location is replaced. The change to the L2P table may be noted for consistency over boot. The change in L2P location may be programmed onto the NAND 104 (e.g., as a full dump of the new L2P table or as a delta of the activity that just transpired with this program). In the event that two writes to the same LBA occurred, only the most-recent write can be part of this dump (so, a consistency check can happen inside this step). Several deltas can be written to the NAND at once.

The controller 102 can also provide functionality for data retention, disturb, and garbage collection. In one embodiment, the controller 102 identifies that data at some location that must move (e.g., for garbage collection or degradation reasons). The controller 102 then reads the data from the media 103, and the L2PM 300 does an update to mark this logical entry as in flight (bit or RAM address update). The controller 102 then checks for this logical address already being in flight for a write, and cancels the data movement since the host is already writing the data. The new location is selected for this data, and the data is transferred to the media 104 and programmed. The L2PM 300 updates this entry to point to the media location, and the delta of activity or full L2P table is sent to the media 104 for consistency of boot at a later time. This delta or L2P table is often done to specific addresses, so that a booting drive may find these locations at boot.

If there is a power loss detected when data is in flight, the write data present in the volatile RAM 305 can be programmed by normal flow of programming to the media 104. Alternatively, the write data present in the volatile RAM 305 can be programmed to a special location. This special location is often selected to improve reliability across boot or accelerate the storing of data prior to power loss. Some of these techniques and locations include SLC instead of TLC, faster programming parameters, reduced verification steps, program with higher margin, or it select a location with better media properties to improve reliability across boot (e.g., SLC instead of TLC). Other data in flight important for a later boot (e.g., logs, metadata, valid counts, media tracking information, L2P tables, L2P table deltas, etc.) can be shuttled to their locations for power off storage (e.g., EEPROM, NOR, NAND, persistent memory (PM). Metadata for controller boot can similarly be dumped to a special non-volatile location for reloading when rebooted.

During boot-up, many different type of situations can occur. For example, in one situation, the storage system 100 can be booted up with a full L2P table in one location. In this situation, the controller 102 turns on, loads firmware, sets up hardware both internal to the ASIC and external on the PCB, which includes powering the media 104 according to its ordering requirements. The controller 102 continues this step as appropriate in parallel through the rest of this process. The controller 102 then brings up an interface through the interface dictated protocol. At this time, the controller 102, has an invalid or empty L2P table in DRAM 315 and reads the L2P table from the previously-identified locations where it might be. If the controller 102 detects a corrupt L2P table, it may proceed with correction procedures such as a duplicated location. In the other situation, the storage system 100 can be booted up with L2P table deltas rather than with a full L2P table. In this situation, after the preliminary steps described above, the controller 102 goes to the prearranged locations to begin reading. If these locations contain the deltas, then the timestamps and the deltas will be read until the table is reconstructed, and the most recent timestamp for the L2P entry is used. If these locations describe the locations of the deltas and their timestamps, then further reads of the deltas proceed and the table is reconstructed similarly.

Figure 4:
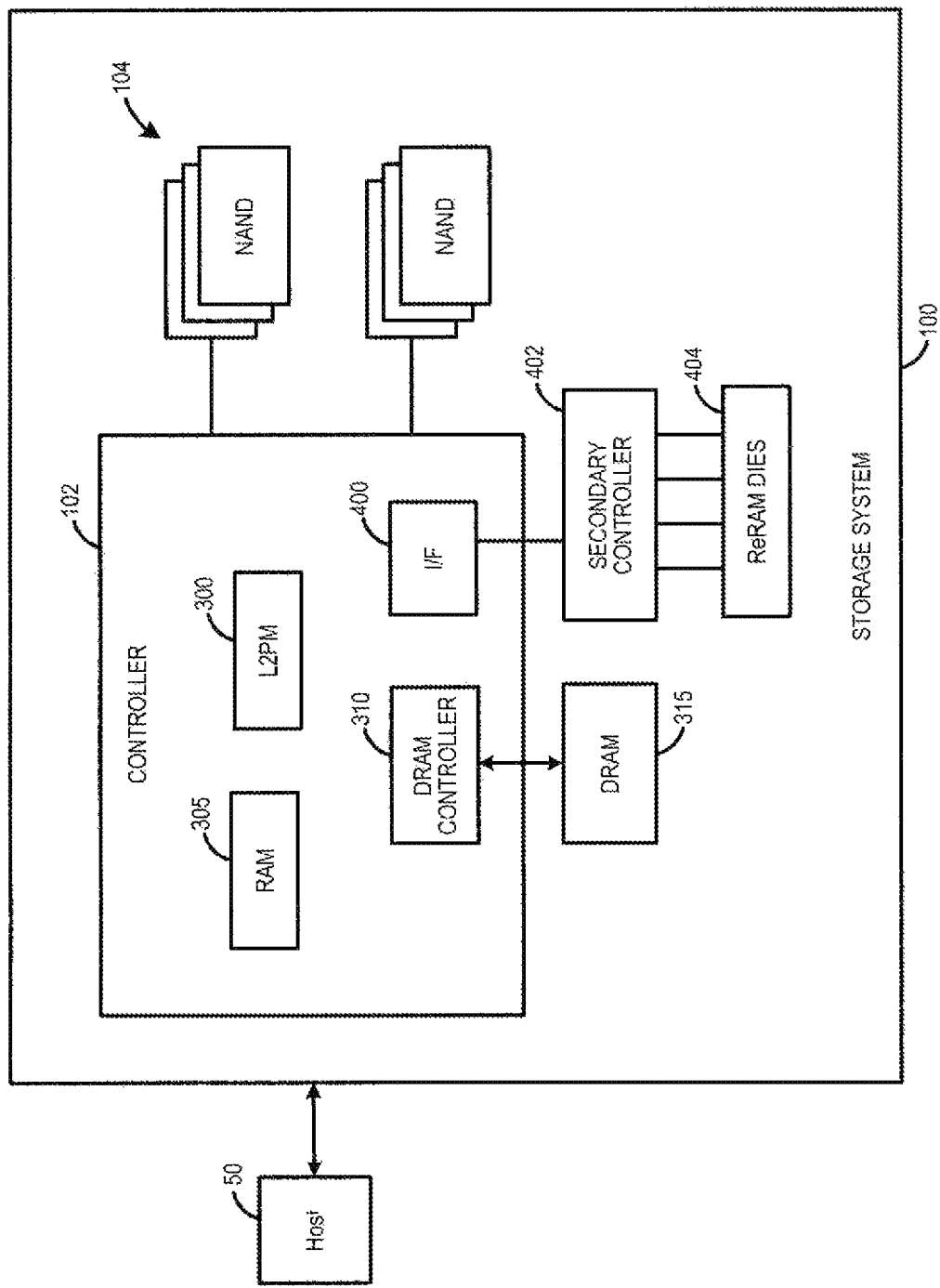
FIG. 4 is a block diagram of a storage system of an embodiment in which a logical-to-physical address table is stored in ReRAM.

Returning to the figures, FIG. 4 is an illustration of the storage system 100 configured in a different way. Specifically, the controller 102 in the storage system 100 in this embodiment comprises an interface 400 that communicates with a secondary controller 402, which communicates with a plurality of ReRAM dies 404. It should be noted that while ReRAM is being used in this example, any type of persistent memory (PM) can be used. As used herein, the phrase "persistent memory" (sometimes called a "storage class memory") refers to a subset of non-volatile memory that is faster than flash and can enable a "program-in-place" functionality. "Program-in-place" refers to the fact that block management of the memory is not needed (e.g., wear leveling can be performed instead of garbage collection). Persistent memory can be used as a replacement for DRAM to keep data temporarily ruggedized with a minimal loss in latency. Examples of persistent memories include, but are not limited to, resistive random access memory (ReRam), phase-change memory (PCM), oxide-based resistive random memory (OxRAM), and magnetoresistive random-access memory (MRAM).

In this embodiment, the ReRAM dies 404 are used instead of the DRAM 315 to store the L2P table. One of the advantages of using ReRAM is that, because it is a persistent memory, the L2P table and/or its deltas do not need to be copied back to the non-volatile memory arrays 104 in all embodiments. Indeed, in some embodiments, the L2P table is only stored in the ReRAM dies 404 and is not initially copied from the non-volatile memory arrays 104. The read operation is similar to the one discussed above, but with the L2PM 300 communicating through the interface 400 and the secondary controller 402 instead of through the DRAM controller 310 (the secondary controller 402 will be discussed in more detail below). The write operation is also similar except for the need to note changes (deltas) to the L2P table. As mentioned above, changes to the L2P table can be made directly to the L2P table stored in the ReRAM 404.

So, there is no need to update the L2P table in the non-volatile memory arrays 104 (if a copy of the L2P table even exists there). Accordingly, in one embodiment, there is no need to create deltas with respect to that table (or a full L2P table), as they will not be send to the media.

If power loss is detected when there is data in flight in this embodiment, the data in flight may either complete standard programming flow if power up energy is sufficient, or it may be left as in-progress and remaining in the ReRam storage medium for continuation at reboot. Metadata present in the volatile RAM 305 can be programmed to a location on non-volatile media 104 or the ReRAM 404.

During a boot operation, the controller 102 may have a valid L2P table in the ReRAM 404. Accordingly, there is no need to copy the L2P from the non-volatile memory 104, as below. Metadata that was shuttled to non-volatile locations 104 is read back into RAM 305, and operations that were not completed at power loss are restarted.

Figure 5:
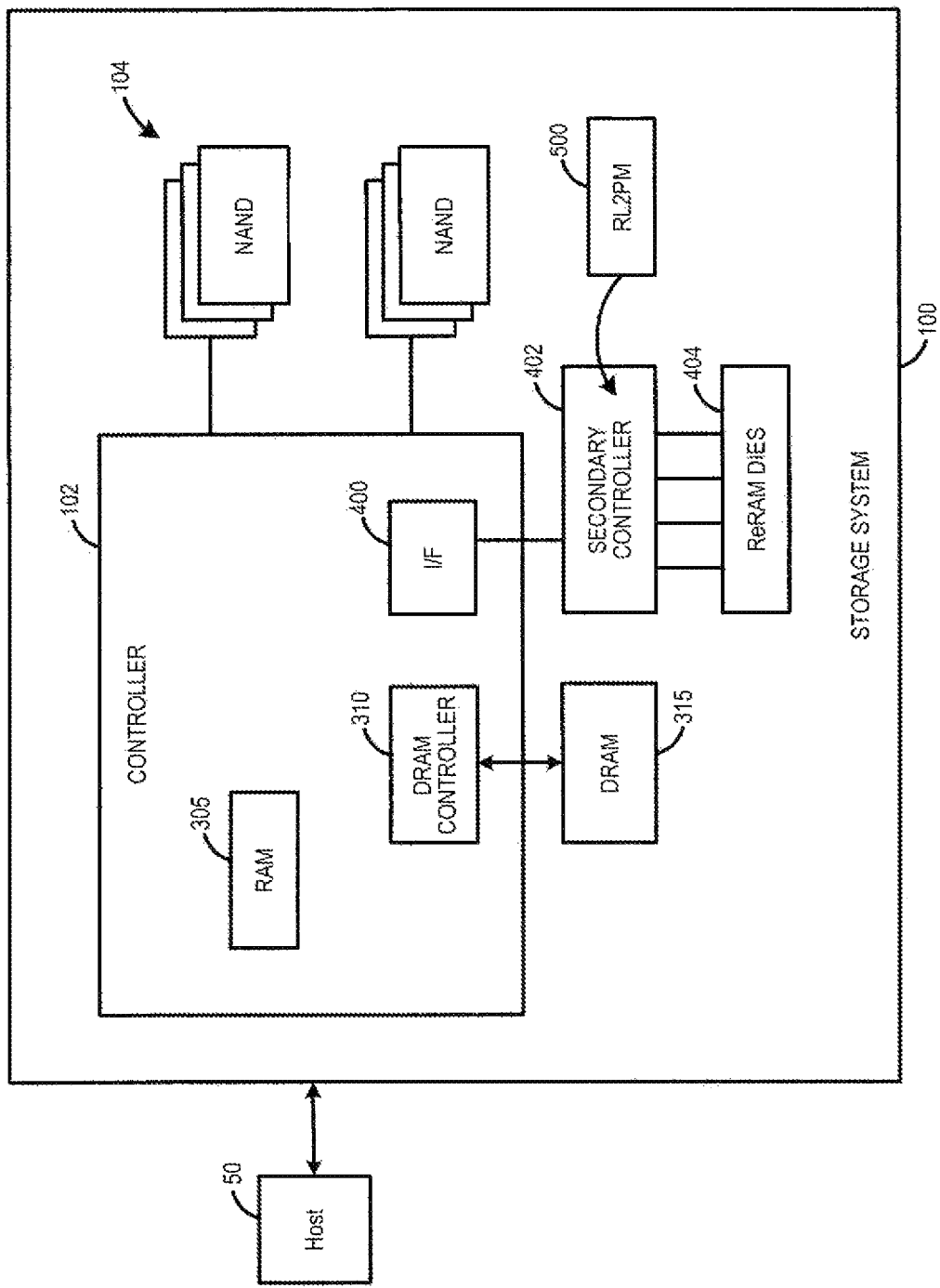
FIG. 5 is a block diagram of a storage system of an embodiment in which a remote logical-to-physical address manager is located in a secondary controller connected to ReRAM.

Returning to the drawings, FIG. 5 is an illustration of another embodiment, in which the L2PM is moved from the controller 102 to the secondary controller 402. The L2PM is called a remote L2PM (or "RL2PM") 500 because it is removed from the primary controller 102. The RL2PM 500 is sometimes referred to as the ReRAM L2PM because it is used to communicate with the L2P table in the ReRAM 404. However, as explained here, the L2PM does not necessarily need to be remote.

Figure 6:
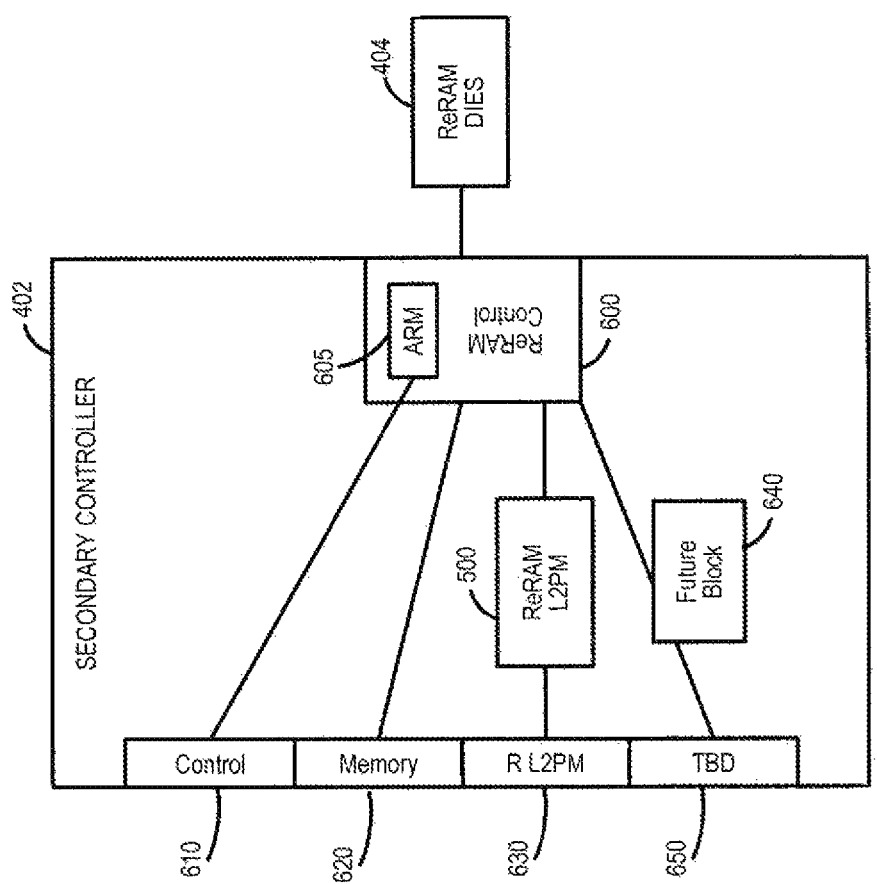
FIG. 6 is an illustration of a secondary controller of an embodiment.
Figure 7:
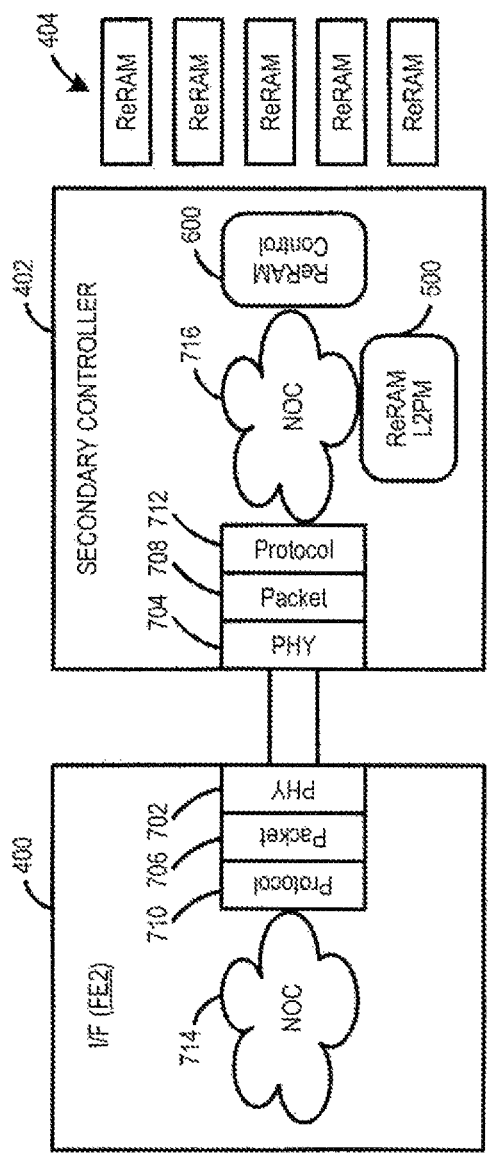
FIG. 7 is an illustration showing communication between a primary controller and a secondary controller of an embodiment.

FIG. 6 is an illustration of one implementation of the secondary controller 402, although other implementations are possible. As shown in FIG. 6, in this embodiment, the secondary controller comprises a ReRAM media controller 600 with an ARM processor 605 and provides a memory interface 620. The ARM processor 605 is a component of the ReRam Controller 600, and it provides an access window for ReRam Memory controller settings, parameters, functions, logs, advanced features, and a generally flexible communication path. The ReRAM controller 600 provides all of the functionality to store and manage the ReRAM 404. This functionality includes wear leveling, degradation management, data scrambling, EDC, ECC, bus scheduling, and defect remapping. The ReRAM controller 600, ARM processor 605, and ReRAM media 404 together provide a non-volatile memory storage subcomponent. ReRam L2PM 500 is also called RL2PM, and it is also providing a management of the L2P table similar to the L2PM 300 with some differences noted below. The secondary controller 402 can have additional functionality above and beyond the nonvolatile memory interface, handling, and storage, which is represented by "future block" 640 and "to be determined (TBD)" 650. FIG. 7 shows an example connection between the secondary controller 402 and interface (front end ("FE") 2) 400 in the primary controller 102. As shown in FIG. 7, the secondary controller 402 and interface 400 have corresponding physical (PHY) 702, 704; Linked Layer (packet) 706, 708; and Data Linked Layer or Transport Layer (protocol) 710, 712, as well as corresponding networks on chip (NOCs) 714, 716. Some PHYs that might be utilized in such a scenario include PCIe's PHY, proprietary SERDES (serializer deserializer), Gen-Z, or M-PHY. Linked layer examples include Interlaken, PCIe's DL, or Gen-Z packet protocol. Transport layers include PCIe's TLP (transport layer packets) and Interlaken packet usage. The NOCs may be implemented by protocols such as AXI and AHB.

There are several advantages associated with moving the L2PM and management to the secondary controller 402. For example, although persistent memory, such as ReRAM, is non-volatile, it may not be as reliable as traditional non-volatile memories, such as NAND (e.g., the bit error rate (BER) may not be sufficient). Accordingly, even though creating deltas to the L2P table are not theoretically needed for non-volatile media (as discussed above), it still may be advantageous to generate and store the deltas, just in case there is a reliability issue with the ReRAM. When the L2PM recognizes a more recent write invalidating an earlier write in the secondary controller 402, rather than one delta showing the write and the very next delta showing an invalidation of that write because of yet another write to the same LBA. Additionally, the updating of the memory location on the ReRam Controller and ReRam memory is contained within the secondary controller rather than triggering extra capacity on the interface. By having the RL2PM 500 be in the secondary controller 402, the RL2PM 500 can collect all the deltas and prepare them for a single data transfer out to the memory 104 via the primary controller 102. The process of storing the deltas in the memory 104 is the same as before. However, having the RL2PM 500 collect the deltas and prepare them for a single data transfer removes extraneous traffic across the interface 400. That is, if the L2PM was in the primary controller 102 instead of the secondary controller 402, each delta would be sent across the interface 400. As there can be multiple deltas for a single logical address but only the latest delta is relevant, this process wastes system resources. In contrast, by having the L2PM be located in the secondary controller 402, the RL2PM 500 can identify duplicated or stale deltas and only send the most recent delta across the interface 400, thereby saving system resources and bandwidth. Further, that delta can be packaged together with other deltas, so only a single data transfer is sent across the interface 400. Further, the RL2PM 500 can perform a compaction/compression operation on the delta segments. That is, the deltas that may be stored in distributed locations can be read together, compacted, aggregated, or otherwise grouped, such that link transfers are better optimized for bandwidth, power, or latency.

The implementation where there are several L2P deltas getting dumped all at once can be done automatically by the RL2PM 500 collecting all the deltas and preparing them for a single data transfer out to the NAND. Again, this removes a lot of the traffic across the interface 400. Collecting all the deltas into one location, so one transfer of all of the updates can be done once across the interface 400 can also be done during controller movement for retention, disturb, and garbage collection. Further, in the situation where there is a power loss when there is data in flight, the RL2PM 500 can take the disaggregated sources of data, collect them together, and transfer them together at one time across the interface 400, thereby reducing interface bandwidth and latencies. Transferring the deltas across the interface 400 can increase the bandwidth across the interface 400, but it allows the work to be done remotely, which can simplify the controller 102 structure and free it up for other boot tasks.

Further, as persistent medias may not be as fast as DRAM 310, to have the same bandwidth in accessing the L2P table in ReRAM 404 as in DRAM 315, the number of parallel commands can be increased. That is, bandwidth is defined in this context as (1/latency)*the number of parallel commands.

When considering a secondary controller with non-volatile media but non-ideal reliability, there are changes that can be made to the boot process of the storage system 100. When booting the memory 600 and ReRam 404 of the full L2P table may be checked for validity similar to that from a non-volatile boot, but the L2P table is read from the memory 104 only if the L2P table in the ReRAM 404 is invalid. A boot with the L2P table delta is also similar, but the controller 102 goes to the prearranged locations only if the L2P table in the ReRAM 404 is invalid.

The following paragraphs provide additional information.

ReRam and other persistent memories are typically not well suited for deployment behind existing DDR interfaces for integration with an SSD controller. One embodiment modifies the existing controller interface and SSD controller architecture to incorporate a variable latency tolerant ReRam access mimicking DRAM, and moving some relevant memory interaction hardware across the interface boundary to remove controller development gating.

Some prior storage systems use an existing DRAM interface and DDR controller with worst-case tolerance of persistent memory latencies to enable a safety margined deployment of persistent memory. The secondary controller 402 discussed above can be considered an internal ReRAM (iRRAM) media based replacement of the majority of the DRAM used by some enterprise SSDs (by moving the L2P metadata storage/access from DRAM to ReRAM). The secondary controller 402 is similar to other persistent memory controllers, with some differentiating features being an interface to the controller 102 (e.g., in one embodiment, an SSD controller 102) and providing ReRam-specific L2P access hardware accelerators in the secondary controller 402. This allows maturing of the secondary controller 402 and relevant SSD controller functions along with the ReRam media 404. It also avoids gating the controller 102 development.

As discussed above, some storage system controllers have a DRAM controller with a variable quantity of DRAM attached through the printed circuit board (PCB) and DRAM controller. The interface for the secondary controller 402 can leverage the existing interface decisions of proprietary SERDES PHY, Interlaken packet, and SIIM protocol. This has the advantage of a proven interface providing a NOC extension. Since the majority of the data used may be accesses specific to the size of the L2P table entries, there can also be some relevant L2P access accelerators placed in the secondary controller 402 to increase multithreaded accesses and improve tolerance to the slower latencies of ReRam 404 compared to DRAM. This can also be optimized to reduce the number of transactions, latency of each transaction, and maximum number of transactions over the interface 400. As noted above, an example of hardware moved from the controller 102 to the secondary controller 104 is the L2PM manager 500. This block is moved so that it can mature along with the ReRam Memory controller 600 and media 404. One change can be improved multithreading. A secondary change can be optimizations as the persistence of the ReRam media is validated. Separating this hardware into the secondary controller 402 avoids gating the SSD controller 102 development.

Figure 8:
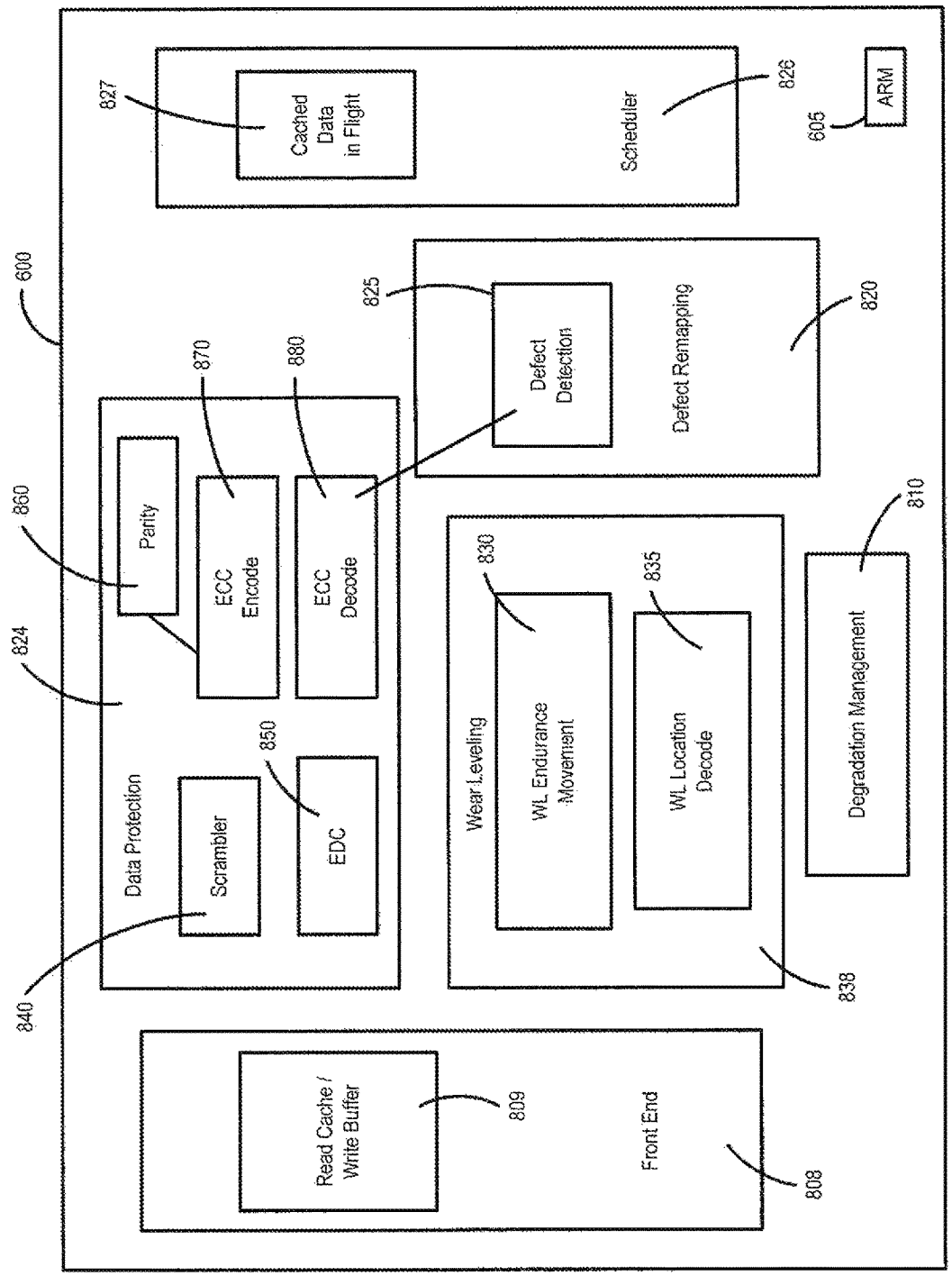
FIG. 8 is an illustration of a ReRAM controller of an embodiment.

The interface to the secondary controller 402 is able to be abstracted to what is shown in FIG. 6. There can be a control path to the processor and hardware debug/status registers. There can be an open memory address range to the ReRam controller 605 that can present the entire memory space to the controller 102 with the added capability to interrupt the controller 102 with exceptions such as read uncorrectable. There can be a window into the ReRam specific L2PM hardware block that can enable both relevant register access and the FIFOs for incoming commands to the L2PM block. There can be other future hardware blocks that are also given access across the interface to the controller 102. Registers and hardware functions inside of the ReRam controller 605 can generally be mastered by the processor that is in the ReRam controller 605. However, their addresses can also be accessible for exception cases from the controller 102. An example implementation of the ReRam controller 605 is shown in FIG. 8. Of course, this is just one example, and other implementations can be used.

Moving the L2PM to be inside of the secondary controller enables the abstract diagram of 402. However, shared parts is possible in embodiments. One example of shared memory is a write buffer for the ReRam Controller and the write buffer of the ReRam L2PM. This shared buffer enables the data to remain in location and a pointer to move through the tasks of the L2PM and the ReRam Controller.

As shown in FIG. 8, the ReRam controller 605 in this embodiment comprises a front end module 808 with a read cache/write buffer 809 for storing data sent from/to the host using an ordered command FIFO. The ReRam controller 605 also comprises a scheduler (sequencer) 826 that schedules read and write operations to the memory 803 and is used for command prioritization and execution and data/location coherence. The ReRam controller 605 further comprises a cache 826 for data in flight between the ReRam controller 605 and the ReRAM 404. In this embodiment, the media management layer 838 includes a wear leveling feature. In this particular embodiment, the wear leveling algorithm is implemented in hardware, although, in other embodiments, it can be implemented in firmware/software. Also, in other embodiments, other or different types of media management layers can be used, such as, but not limited to, garbage collection. Further, the degradation module 810 can implement various algorithms to manage the degradation of the memory cells in the ReRAM 404 (e.g., read/program disturbs, neighbor disturbs, and data retention issues from age or heat).

In this embodiment, the wear leveling module 838 comprises a wear leveling endurance movement module 830 and a wear leveling location decode module 835. In operation, the ReRam controller 605 receives data and a logical address received from the host. The wear leveling endurance movement module 830 contains counters tracking how many times different memory regions (e.g., pages or blocks) have been written to. The wear leveling endurance movement module 830 can choose a memory region to store the data based on the values of the counters, to make sure that all of the memory regions are being used as equally as possible, so no one memory region wears out before the others from use. The physical address of the chosen region is stored in the wear leveling decode module 835, which contains a data structure (e.g., a table, or algorithm with supporting metadata) that associates the logical address from the write command with the physical address used to store the data. That way, when the ReRam controller 605 later receives a read command and logical address from the host to read the data, the wear leveling decode module 835 can look up the physical address associated with the logical address, read the physical address in ReRAM 404, and send the data to the host (after temporarily storing the data in the caches 826, 808 as the data moves through the ReRam controller 605).

The ReRam controller 605 also comprises a data protection module 824 comprising a data scrambler (or randomizer) 840, an error detection code (EDC) engine 350, an error correction code (ECC) encoder 870, and an ECC decoder 880. In operation, the data protection module 824 can be used to process the data being read/written for data protection purposes. For example, after getting data to be written from the write buffer 808, the scrambler 840 can scramble the sequence of bits in the data, and then the EDC engine 810 can generate an error detection code. The error detection code and the data are then used by the ECC engine 870 to generate ECC parity bits 860. The data, error detection code, and ECC parity bits 860 are then stored in the ReRam 404. When the data is later read, the ECC decoder 380 decodes the data and corrects any correctable error. If an error occurs due to a memory defect (e.g., a grown defect), a defect remapping module 820 detects the error with a defect detection module 825, marks the block as bad, and maps the bad block to a good block. All ECC algorithms have a possibility of having the bits in error exceed their correction capability. If the correction capability of the ECC algorithm is exceeded, the ECC algorithm has a small but non-zero chance of thinking it succeeded in correcting the data. The ECC algorithm will then report "corrected", and an EDC code is used to confirm that there is not a silent error. If the EDC fails, it will not be able to correct it. However, mitigating paths may be followed. These mitigating paths include but are not limited to re-reads with different parameters, outer protection ECC codes, or returning a failed read status. The failed read status is preferable to returning the data and not knowing it was wrong. If the data does not contain an error or contains an error that was corrected, the data is sent to the scrambler module 840 to descramble the data, and then the data is sent to read cache 808, where it is then sent to the host.

There are several advantages of using the secondary controller 404 discussed above. These include the following:

A new variable-tolerant interface enables persistent memory access through a memory window with variable response times.

An ability to optimize for the access sizes particular to this L2P table implementation.

A lower power SERDES interface (active and idle) compared to parallel DDR interface.

Leveraging existing FE-FM interface to enable accelerated development due to existing deployment.

Providing a "NOC extension" to extend the addressability of the controller 102 and secondary controller 104 registers and memory spaces for easier firmware programming, debugging, and controller 102 to secondary controller 104 accesses.

The ability to shift hardware engines such as the L2PM engine into the secondary controller 104 for later development without gating the development of the controller 103.

Isolation of ReRam media and controller immaturity from the controller 102 to allow separated developments.

Extended multi-threading capabilities.

Isolated maturity of features such as persistence of the ReRam media.

Further, as DRAM is an increasingly large cost of a storage system, replacing DRAM with ReRam saves cost, power, enables persistence, and decreases PCB board area. Designing the interface to allow for a higher latency memory than DRAM will allow replacement of DRAM with ReRAM or any other competing storage class memory. Designing the interface into an ASIC before the memory controller is available allows for a product level controller to be reused and accept/add the new memory and secondary controller 104 without incurring a large cost or schedule hit for a new main controller (FE).

Additional advantages/features of these embodiments include: DRAM replacement, persistence to avoid logging to NAND, method of keeping some items in DRAM to cherry pick the structures replaced (large size, low BW to ReRAM), only writing to off-load FW (no direct reads), remembering non-persistence writes to R-L2PM to avoid media write endurance, grouping structures to write or pull to the secondary controller—and caching these items in the secondary controller and to aggregate out-of-order programs, and caching read data (compares) to use later in conditional writes. Further advantages/features of these embodiments include: a method for replacing DRAM with persistent memory, a remotely located ReRam controller with associated hardware that is ReRam-integration-bound along with an interface and protocol between the two that is abstracted from ReRam media and utilizes the ReRam controller memory interface (e.g., that can follow secure boots or front-end mastered boot processes), persistent memory of data inflight through the storage system 100, all transactions across the link may be 'posted' (e.g., firmware sends the information without waiting for a response keeping the link in a non-blocked state), dual existence of DRAM and ReRam (e.g., methodology for determining information that goes into DRAM versus what goes into ReRam, the way this decision changes for persistent versus non-persistent, and system level power fail protections sized appropriately for what is to be flushed from the reduced DRAM info), persistence of metadata to reduce logging and enhance boot time, and hardware optimizations for support hardware that gets moved over to the secondary controller (e.g., reducing traffic over the link in order to use more intelligence, such as by reading and comparing in secondary controller rather than back to controller, batching and defined structures for communications, and array look-ups and follow on look-ups/actions get ported over to be self-contained inside the secondary controller rather than two-link transfers to front-end firmware.

Yet other advantages/features of DRAM and partial DRAM replacement with remotely attached persistence memory include: replacing large DRAM meta data structures in SSD (L2P) with persistence memory as a method to save power, area and cost; achieving better time to ready after boot; and lowering bandwidth for meta-data logging from DRAM to NAND (no longer need power loss protection of this L2P table); protocol aspects related to the method to off-loading firmware and keep processing speed for metadata (e.g., write (posted) to remote L2PM and secondary controller (no reads) and creating contiguous structures to convey all relating information for writing to memory or when returning read data (log staging). (Example: conditional update where old addresses are checked for a delta prior to an update and an error would trigger on mismatch . . . (2) for log staging, read data from media can all be returned to contiguous area in a secondary controller RAM. Only one pointer (read return address) needs to be sent over the link.), method of selecting data structures to include in off-loaded memory (e.g., do not replace all DRAM/keep a tier of memory including much smaller DRAM, structures are first rated from lower to higher bandwidth and smaller to larger amount of memory (examples: logical to physical mapping table, debug logs, XOR data, other metadata (partition tables and erase block tracking tables . . . )), and lowest bandwidth and highest size structures selected to off-load; selected in order until diminishing returns on cost, area, power, and bandwidth.

Additional advantages and features include: a method to avoid redundant reads for garbage collection (GC) and other metadata. Add intelligence and buffering in the secondary controller to maintain the previous read of an LBA and used on conditional updates to know if a GC move is allowed to update LBA; media/interface related aspects (e.g., methods to maintain Quality of Service (QoS) and overcome non-symmetric nature of memory read/write times: write data can be marked as non-persistent and kept in cache only.

Enhances media endurance and reduces programing power/time. Used for L2P metadata which points to non-persistent host data in SRAM cache; these L2P entries do not survive a power cut), reads not in cache are given priority over writes at memory for best read latency. Write buffer/cache can buffer posted write data (updates) waiting to program to media (off-loads firmware and interface), supply data for reads that are requested before programing to media, lower media program rates by aggregating multiple writes found to be destined to a common media area, and increasing importance with drive size for the logical to physical tables and other tables for multiple layers of indirection.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode or transistor circuitry, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three-dimensions, such as a two-dimensional memory structure or a three-dimensional memory structure.

In a two-dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements in each column. The columns may be arranged in a two-dimensional configuration, e.g., in an x-z plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of ordinary skill in the art will recognize that this invention is not limited to the two-dimensional and three-dimensional structures described but cover all relevant memory structures within the spirit and scope of the invention as described herein and as understood by one of ordinary skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the embodiments described herein can be used alone or in combination with one another.

What is claimed is:

1. A method, comprising:
receiving, via a host interface of a primary controller, a plurality of write operations from a host;
updating, via a logical-to-physical address manager of a secondary controller, a logical-to-physical address table in a persistent memory based on the plurality of write operations;
collecting, via the secondary controller, a group of changes to the logical-to-physical address table in the persistent memory based on the updating;
sending, via a controller interface of the secondary controller in communication with the primary controller, at least a sub-set of the group of changes for storage in a non-volatile memory; and
when at least a portion of the logical-to-physical address table in the persistent memory is valid, declining to copy the at least a portion of the logical-to-physical address table from the non-volatile memory into the persistent memory,
wherein a data storage system comprises the second controller, the persistent memory and the non-volatile memory, and
wherein the data storage system is separate and different from the host.

2. The method of claim 1, wherein sending the at least the sub-set of the group of changes comprises most-recent changes for each logical address of the updating.

3. The method of claim 1, wherein sending the at least the sub-set of the group of changes excludes duplicate and stale changes to the logical-to-physical address table.

4. The method of claim 1, wherein the storage in the non-volatile memory is separate from the persistent memory.

5. The method of claim 1, further comprising:
increasing, via the secondary controller, a queue depth of commands sent to the persistent memory to match a bandwidth between the primary controller and a volatile memory.

6. The method of claim 1, wherein the non-volatile memory comprises a three-dimensional memory.

7. The method of claim 1, further comprising:
disconnecting the host interface from the host; and
reconnecting the host interface to the host.

8. The method of claim 1, further comprising:
in response to detecting power loss, causing the at least a portion of the logical-to-physical address table to remain in or to be written to the persistent memory for power off storage; and
in response to the host re-booting after the power loss, verifying whether the at least a portion of the logical-to-physical address table in the persistent memory is valid.

9. The method of claim 1, wherein:
the data storage system comprises the primary controller; and
the primary controller is different from the secondary controller.

10. A data storage device, comprising:
volatile memory;
a non-volatile memory;
a first controller for communication with the non-volatile memory via a memory interface, wherein the first controller comprises a host interface configured to receive a plurality of write operations from a host; and
a second controller for communication with the first controller via a controller interface of the first controller and the volatile memory, wherein the second controller comprises a remote logical-to-physical address manager configured to access and update, based on the plurality of write operations, a logical-to-physical address table copied from the non-volatile memory to the volatile memory,
wherein the second controller is further configured to collect, based on the updating, a group of changes to the logical-to-physical address table in the volatile memory and send, via the controller interface, at least a sub-set of the group of changes for storage in the non-volatile memory,
wherein when at least a portion of the logical-to-physical address table in the volatile memory is valid, the data storage device is configured to cause declining to copy the at least a portion of the logical-to-physical address table from the non-volatile memory into the volatile memory, and
wherein the data storage device is separate and different from the host.

11. The data storage device of claim 10, wherein the second controller is configured to include most-recent changes for each logical address of the updating of the logical-to-physical address table within the at least the sub-set of the group of changes.

12. The data storage device of claim 10, wherein the second controller is configured to exclude duplicate and stale changes to the logical-to-physical address table from the at least the sub-set of the group of changes.

13. The data storage device of claim 10, wherein the non-volatile memory comprises a three-dimensional memory.

14. The data storage device of claim 10, wherein the data storage device is removably connected to the host.

15. A data storage device comprising:
means for receiving a plurality of write operations from a host;

means for updating a logical-to-physical address table in a persistent memory based on the plurality of write operations;

means for collecting a group of changes to the logical-to-physical address table in the persistent memory based on the updating of the logical-to-physical address table; and means for sending at least a sub-set of the group of changes for storage in a non-volatile memory, means for declining to copy at least a portion of the logical-to-physical address table from the non-volatile memory into the persistent memory, when the at least a portion of the logical-to-physical address table in the persistent memory is valid, wherein the data storage device comprises the persistent memory and the non-volatile memory, and wherein the data storage device is separate and different from the host.

16. The data storage device of claim 15, wherein the means for receiving comprises a host interface of a primary controller.

17. The data storage device of claim 15, wherein the means for updating comprises a logical-to-physical address manager of a secondary controller.

18. The data storage device of claim 15, wherein the means for sending comprises a controller interface of a secondary controller in communication with the means for receiving.

19. The data storage device of claim 15, wherein the persistent memory and the non-volatile memory are separate.

20. The data storage device of claim 15, wherein the means for sending is configured to exclude duplicate and stale changes to the logical-to-physical address table from the at least the sub-set of the group of changes.

* * * * *